(12) United States Patent
Park et al.

(10) Patent No.: US 11,461,176 B2
(45) Date of Patent: Oct. 4, 2022

(54) MEMORY DEVICE AND MEMORY SYSTEM

(71) Applicant: SAMSUNG ELECTRONICS CO., LTD., Suwon-si (KR)

(72) Inventors: Jun Young Park, Yongin-si (KR); Young-Hoon Son, Yongin-si (KR); Hyun-Yoon Cho, Uiwang-si (KR); Young Don Choi, Cheongju-si (KR); Jung Hwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/398,158

(22) Filed: Aug. 10, 2021

(65) Prior Publication Data
US 2022/0138045 A1   May 5, 2022

(30) Foreign Application Priority Data
Oct. 30, 2020   (KR) .................. 10-2020-0142873

(51) Int. Cl.
*G06F 11/10* (2006.01)
*H03M 13/29* (2006.01)
*G06F 1/08* (2006.01)

(52) U.S. Cl.
CPC ............ *G06F 11/1076* (2013.01); *G06F 1/08* (2013.01); *H03M 13/2906* (2013.01)

(58) Field of Classification Search
CPC ... G06F 11/1076; G06F 1/08; H03M 13/2906
See application file for complete search history.

(56) References Cited

U.S. PATENT DOCUMENTS

| | | |
|---|---|---|
| 7,532,052 B2 | 5/2009 | Nonaka |
| 9,444,442 B2 | 9/2016 | Chandrasekaran et al. |
| 9,559,880 B1 | 1/2017 | Cirit et al. |
| 9,742,594 B2 | 8/2017 | Dallaire et al. |
| 9,998,125 B2 | 6/2018 | Balamurugan et al. |
| 10,277,435 B2 | 4/2019 | Hollis et al. |
| 10,680,592 B2 | 6/2020 | Zhao et al. |

(Continued)

OTHER PUBLICATIONS

European Search Report dated Mar. 4, 2022 In Corresponding EP Application No. 21187134.8-1203.

(Continued)

*Primary Examiner* — Kyle Vallecillo
(74) *Attorney, Agent, or Firm* — F. Chau & Associates, LLC

(57) ABSTRACT

A memory device includes a multiphase clock generator which generates a plurality of divided clock signals, a first error correction block which receives a first divided clock signal among the plurality of divided clock signals, a first data multiplexer which transmits first least significant bit data corresponding to the first divided clock signal, a second error correction block which receives the first divided clock signal, and a second data multiplexer which transmits first most significant bit data corresponding to the first divided clock signal. The first error correction block receives the first least significant bit data and corrects a toggle timing of the first least significant bit data. The second error correction block receives the first most significant bit data and corrects a toggle time of the first most significant bit data.

20 Claims, 13 Drawing Sheets

(56) References Cited

U.S. PATENT DOCUMENTS

| | | | |
|---|---|---|---|
| 2002/0105386 A1* | 8/2002 | Shastri | H04L 7/0337 331/25 |
| 2013/0033294 A1* | 2/2013 | Choi | H03K 21/38 327/175 |
| 2020/0106429 A1 | 4/2020 | Doppalapudi et al. | |
| 2020/0258557 A1 | 8/2020 | Giovannini et al. | |

OTHER PUBLICATIONS

European 1st Office Action dated Mar. 16, 2022 In Corresponding EP Application No. 21187134.8-1203.

\* cited by examiner

MEMORY DEVICE AND MEMORY SYSTEM

CROSS-REFERENCE TO RELATED APPLICATIONS

This application claims priority under 35 U.S.C. § 119 to Korean Patent Application No. 10-2020-0142873, filed on Oct. 30, 2020, the disclosure of which is incorporated by reference herein in its entirety.

TECHNICAL FIELD

Embodiments of the present disclosure relate to a memory device and a memory system.

DISCUSSION OF RELATED ART

In a system which includes a plurality of semiconductor devices and in which multi-level signaling is used, a semiconductor memory device can store data. In response to a data processing device such as, for example, a central processing unit (CPU), requesting data, the semiconductor memory device may output data corresponding to an address input from the data processing device or may store data at the input address.

As the operating speed of systems including semiconductor devices has increased and technology regarding semiconductor integrated circuits (IC) has further developed, it is desirable for semiconductor memory devices to output and store data at an increased speed. As a result, synchronous memory devices capable of inputting/outputting data in synchronization with a system clock for inputting/outputting data at high speed, as well as double data rate (DDR) synchronous memory devices that input/output data at rising and falling edges of a system clock, have been developed.

SUMMARY

Embodiments of the present disclosure provide a memory device in which multi-level signaling is used and which removes an error(s) in a multiphase clock.

Embodiments of the present disclosure also provide a memory system which removes an error(s) in a multiphase clock in a memory device in which multi-level signaling is used.

According to an embodiment of the present disclosure, there is provided a memory device including a multiphase clock generator configured to generate a plurality of divided clock signals, a first error correction block configured to receive a first divided clock signal among the plurality of divided clock signals, a first data multiplexer configured to transmit first least significant bit data corresponding to the first divided clock signal, a second error correction block configured to receive the first divided clock signal, and a second data multiplexer configured to transmit a first most significant bit data corresponding to the first divided clock signal. The first error correction block receives the first least significant bit data and corrects a toggle timing of the first least significant bit data, and the second error correction block receives the first most significant bit data and corrects a toggle time of the first most significant bit data.

According to an embodiment of the present disclosure, there is provided a memory device including a memory interface, a control logic circuit receiving a command from the memory interface, and a memory cell array controlled by the control logic circuit and storing data. The memory interface generates a plurality of divided clock signals via a multiphase clock generator, receives a first divided clock signal among the plurality of divided clock signals via a first error correction block and transmits first least significant bit data corresponding to the first divided clock signal via a first data multiplexer, and receives the first divided clock signal via a second error correction block and transmits first most significant bit data corresponding to the first divided clock signal via a second data multiplexer. The first error correction block receives the first least significant bit data and corrects a toggle time of the first least significant bit data, and the second error correction block receives the first most significant bit data and corrects a toggle time of the first most significant bit data.

According to an embodiment of the present disclosure, there is provided a memory system including a memory controller including a controller interface circuit, and a memory device including a memory interface which receives a signal from the memory controller, a control logic circuit which receives a command from the memory interface, and a memory cell array which stores data and is connected to the control logic circuit. The memory interface includes a multiphase clock generator which generates a plurality of divided clock signals, a first error correction block which receives a first divided clock signal among the plurality of divided clock signals, a first data multiplexer which transmits first least significant bit data corresponding to the first divided clock signal, a second error correction block which receives the first divided clock signal, and a second data multiplexer which transmits first most significant bit data corresponding to the first divided clock signal. The first error correction block receives the first least significant bit data and corrects a toggle time of the first least significant bit data, and the second error correction block receives the first most significant bit data and corrects a toggle time of the first most significant bit data.

BRIEF DESCRIPTION OF THE DRAWINGS

The above and other features of the present disclosure will become more apparent by describing in detail embodiments thereof with reference to the accompanying drawings, in which.

DETAILED DESCRIPTION

Figure 1:
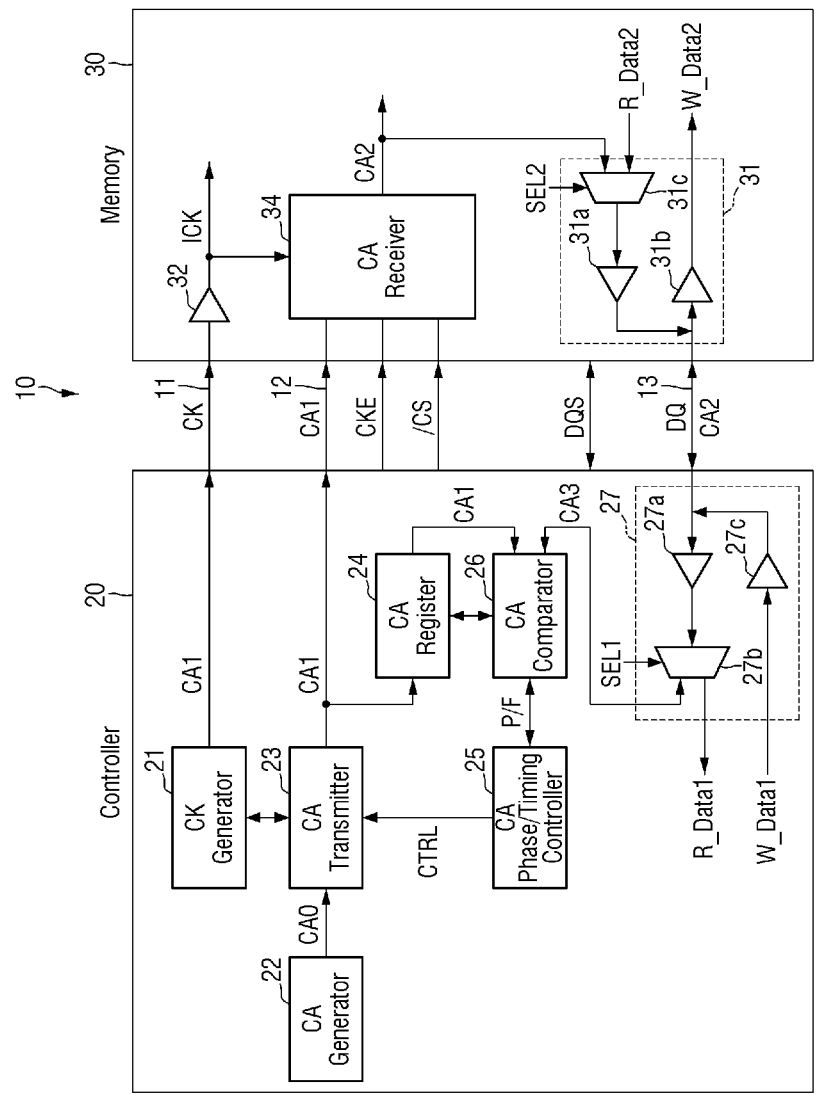
FIGS. 1 and 2 illustrate a memory system according to some embodiments of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 2:
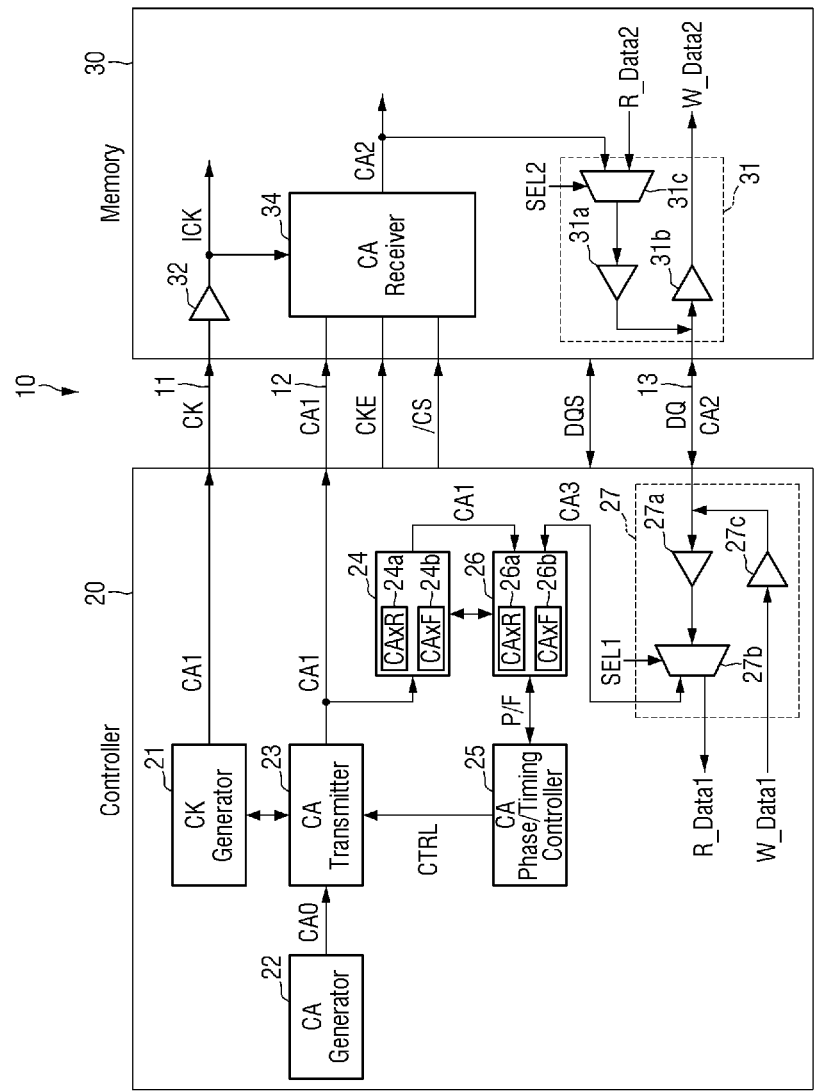

FIGS. 1 and 2 illustrate a memory system according to some embodiments of the present disclosure.

Referring to FIG. 1, a memory system 10 includes a memory controller 20 and a memory device 30. The memory controller 20 includes a clock signal generator ("CK Generator") 21, a command/address generator ("CA Generator") 22, a clock signal transmitter ("CA Transmitter") 23, a command/address register ("CA Register") 24, a command/address comparator ("CA Comparator") 26, a command/address phase/timing controller ("CA Phase/Timing Controller") 25, and a data input/output unit 27.

The memory controller 20 may provide a clock signal CK, which is generated by the clock signal generator 21, to the memory device 30 via a clock signal line 11. The command/address generator 22 may generate an initial command/address signal CA0 and may provide the initial command/address signal CA0 to the command/address transmitter 23.

The command/address transmitter 23 may receive the initial command/address signal CA0 and may generate a first command/address signal CA1 by controlling the phase or timing of the initial command/address signal CA0 in response to a control signal CTRL from the command/address phase/timing controller 25. The first command/address signal CA1 may be provided to, and stored in, the command/address register 24. The first command/address signal CA1 may be provided to the memory device 30 via a command/address bus 12. The first command/address signal CA1 may be provided to the memory device 30 together with the clock signal CK.

The command/address register 24 stores the first command/address signal CAL The command/address comparator 26 compares the first command/address signal CA1 stored in the command/address register 24 with a third command/address signal CA3 output from the data input/output unit 27. The command/address comparator 26 may compare the first command/address signal CA1 with the third command/address signal CA3 and may output a pass/fail signal P/F based on the result of the comparison.

The command/address register 24 and the command/address comparator 26 may store and compare the first command/address signal CA1 and the third command/address signal CA3 at rising and falling edges of the clock signal CK, as described with reference to FIG. 2.

Referring to FIG. 2, the command/address register 24 may include a first register 24a, which stores the first command/address signal CA1 at a rising edge of the clock signal CK, and a second register 24b, which stores the first command/address signal CA1 at a falling edge of the clock signal CK. The command/address comparator 26 may include a first comparator 26a, which compares the first command/address signal CA1 with the third command/address signal CA3 at a rising edge of the clock signal CK, and a second comparator 26b, which compares the first command/address signal CA1 with the third command/address signal CA3 at a falling edge of the clock signal CK.

The first comparator 26a may generate a first pass/fail signal by comparing the first command/address signal CA1 with the third command/address signal CA3 at a rising edge of the clock signal CK. The second comparator 26b may generate a second pass/fail signal by comparing the first command/address signal CA1 with the third command/address signal CA3 at a falling edge of the clock signal CK. The command/address comparator 26 may generate the pass/fail signal P/F by performing a logic OR operation on the first and second pass/fail signals.

Referring again to FIG. 1, the command/address phase/timing controller 25 generates the control signal CTRL that gives instructions to shift the phase of the first command/address signal CA1 in accordance with the pass/fail signal P/F from the command/address comparator 26. The control signal CTRL is provided to the command/address transmitter 23, and the command/address transmitter 23 generates the first command/address signal CA1 by controlling the phase or timing of the initial command/address signal CA0.

In a regular mode, the data input/output unit 27 receives read data R_Data1 from the memory device 30 via a data bus ("DQ") 13 or transmits write data W_Data1 to the memory device 30 via the DQ bus 13. In a calibration mode, the data input/output unit 27 receives a second command/address signal CA2 corresponding to the first command/address signal CA1 received by the memory device 30, from the memory device 30 via the DQ bus 13.

The data input/output unit 27 includes an input buffer 27a, a selector 27b, and an output buffer 27c. The input buffer 27a receives data and the second command/address signal CA2 via the DQ bus 13. The selector 27b transmits the data received by the input buffer 27a to the inner circuit block of the memory controller 20 as the read data R_Data1 in response to a first selection signal SEL1 in the regular mode or transmits the second command/address signal CA2 received by the input buffer 27a to the command/address comparator 26 as the third command/address signal CA3 in response to the first selection signal SEL1 in the calibration mode. The output buffer 27c transmits the write data W_Data1, which is to be written to the memory device 30, to the memory device 30 via the DQ bus 13.

The memory device 30 includes a clock buffer 32, a command/address receiver ("CA Receiver") 34, and a data inputter/outputter 31. The memory device 30 may include dynamic random access memory (DRAM) cells. The clock buffer 32 receives the clock signal via the clock signal line 11 and generates an inner clock signal ICK. The command/address receiver 34 generates the second command/address signal CA2 in accordance with a chip selection signal /CS, a clock enable signal CKE, and the first command/address signal CA1, which is transmitted via the command/address bus 12, in response to the inner clock signal ICK. The chip selection signal /CS and the clock enable signal CKE may be separate from the command/address bus 12, as illustrated in FIG. 1, or may be transmitted to the memory device 30 by being included in the command/address bus 12. The command/address bus 12 may also be referred to as a command/address signal line.

The clock enable signal CKE may be used as a pseudo command, which functions as a read command of the first command/address signal CA1 transmitted via the command/address bus 12. The command/address receiver 34 generates the second command/address signal CA2 in accordance with the first command/address signal CA1 received when the clock enable signal CKE is active. The second command/address signal CA2 is provided to the data inputter/outputter 31.

The data inputter/outputter 31 receives read data R_Data2 from the inner circuit block of the memory device 30 and transmits the read data R_Data2 to the DQ bus 13 in response to a second selection signal SEL2 in a regular read mode, or transmits the second command/address signal CA2 to the DQ bus 13 in response to the second selection signal SEL2 in the calibration mode. The data inputter/outputter 31 receives the write data W_Data1 via the DQ bus 13 and transmits the write data W_Data1 to the inner circuit block of the memory device 30 in a regular write mode. The data inputter/outputter 31 includes a selector 31c, an output buffer 31a, and an input buffer 31b. The selector 31c selects one of the second command/address signal CA2, which is output from the command/address receiver 34, and the read data R_Data2, which is provided by the inner circuit block of the memory device 30, in response to the second selection signal SEL2 in the regular/calibration mode and transmits whichever of the second command/address signal CA2 and the read data R_Data2 is selected to the output buffer 31a.

The output buffer 31a transmits the second command/address signal CA2 or the read data R_Data2, output from the selector 31c, to the DQ bus 13. The input buffer 31b receives data transmitted via the DQ bus 13 and transmits the received data to the inner circuit block of the memory device 30 as write data W_Data2.

An example in which the second command/address signal CA2 output from the output buffer 31a of the memory device 30 is provided to the memory controller 20 via the DQ bus 13 has been described. Alternatively, the second command/address signal CA2 output from the output buffer 31a of the memory device 30 may be provided to the memory controller 20 via a data strobe bus ("DQS") and the DQ bus 13. The data input/output unit 27 of the memory controller 20 and the data inputter/outputter 31 of the memory device 30 may be connected via the data strobe bus and the DQ bus 13.

Figure 3:
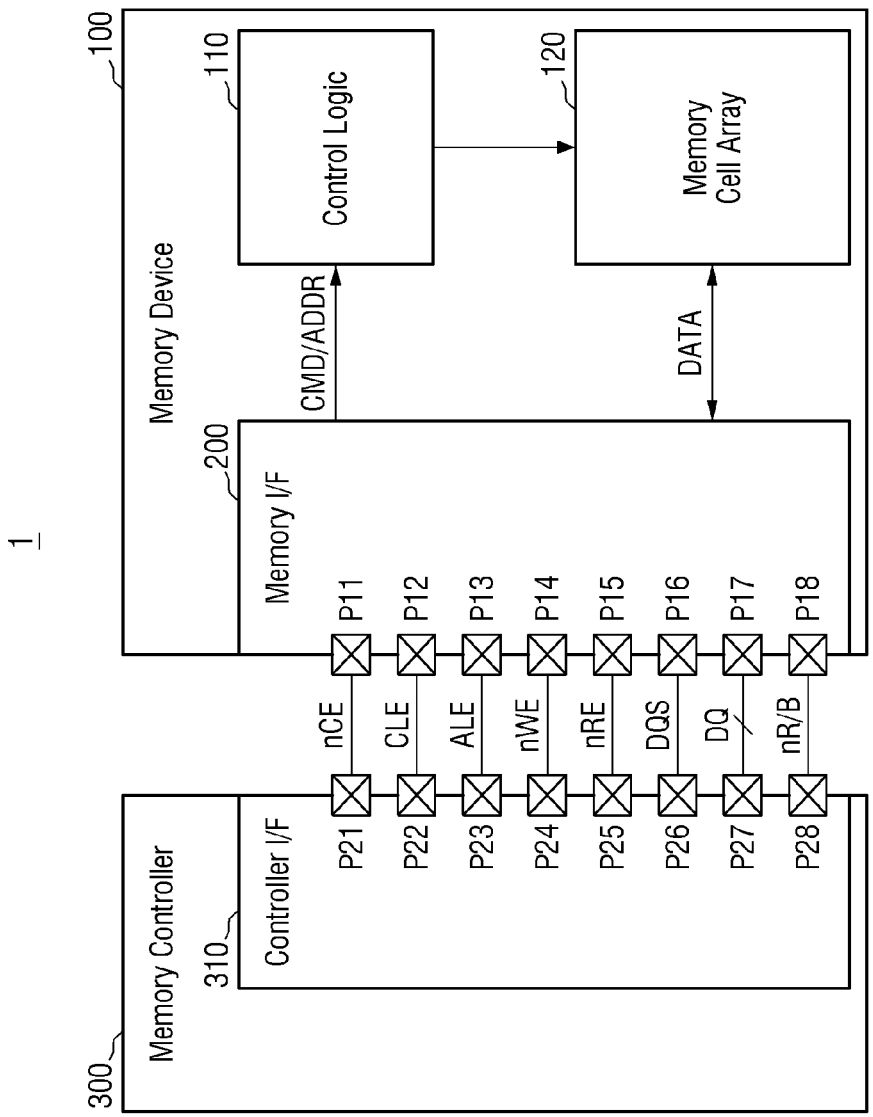
FIG. 3 illustrates a memory system according to some embodiments of the present disclosure.

FIG. 3 illustrates a memory system according to some embodiments of the present disclosure.

Referring to FIG. 3, a memory system 1 may include a memory device 100 and a memory controller 300. The memory device 100 may be a nonvolatile memory device that communicates with the memory controller 300 via one of a plurality of channels.

The memory device 100 may include first through eighth pins P11 through P18, a memory interface ("Memory I/F") 200, a control logic circuit 110, and a memory cell array 120.

The memory interface 200 may receive a chip enable signal nCE from the memory controller 300 via the first pin P11. The memory interface 200 may transmit signals to, or receive signals from, the memory controller 300 via the second through eighth pins P12 through P18 in accordance with the chip enable signal nCE. For example, in a case in which the chip enable signal nCE is in an enabled state (for example, has a low level), the memory interface 200 may transmit signals to, or receive signals from, the memory controller 300 via the second through eighth pins P12 through P18.

For example, the memory interface 200 may receive a command latch enable signal CLE, an address latch enable signal ALE, and a write enable signal nWE from the memory controller 300 via the second through fourth pins P12 through P14. The memory interface 200 may receive a data signal DQ from the memory controller 300 via the seventh pin P17 or may transmit the data signal DQ to the memory controller 300 via the seventh pin P17. A command CMD, an address ADDR, and data "DATA" may be transmitted via the data signal DQ. For example, the data signal DQ may be transmitted via a plurality of data signal lines. In this example, the seventh pin P17 may include a plurality of pins corresponding to a plurality of data signals.

The memory interface 200 may acquire the command CMD from the data signal DQ received during an enabled period (for example, a high-level period) of the command latch enable signal CLE, based on the toggle timing of the write enable signal nWE. The memory interface 200 may acquire the address ADDR from the data signal DQ received during an enabled period (for example, a high-level period) of the address latch enable signal ALE, based on the toggle timing of the write enable signal nWE.

The write enable signal nWE may maintain a static state (for example, a high level or a low level) and may then toggle between the high level and the low level. For example, the write enable signal nWE may toggle during the transmission of the command CMD or the address ADDR. Accordingly, the memory interface 200 may acquire the command CMD or the address ADDR based on the toggle timing of the write enable signal nWE.

The memory interface 200 may receive a write enable signal nRE from the memory controller 300 via the fifth pin P15. The memory interface 200 may receive a data strobe signal DQS from the memory controller 300 via the sixth pin P16 or may transmit the data strobe signal DQS to the memory controller 300 via the sixth pin P16.

During the output of the data "DATA" by the memory device 100, the memory interface 200 may receive the write enable signal nRE, which toggles, via the fifth pin P15 before outputting the data "DATA". The memory interface 200 may generate a data strobe signal DQS that toggles in accordance with the toggling of the write enable signal nRE. For example, the memory interface 200 may generate a data strobe signal DQS that begins to toggle a predetermined delay after the beginning of the toggling of the write enable signal nRE. The memory interface 200 may transmit a data signal DQ including the data "DATA" based on the toggle timing of the data strobe signal DQS. Accordingly, the data "DATA" can be aligned with the toggle timing of the data strobe signal DQS, and can thus be transmitted to the memory controller 300.

During the input of the data "DATA" by the memory device 100, in a case in which a data signal DQ including the "DATA" is received from the memory controller 300, the memory interface 200 may receive the data strobe signal DQS, which toggles, together with the data "DATA". The memory interface 200 may acquire the data "DATA" from the data signal DQ based on the toggle timing of the data strobe signal DQS. For example, the memory interface 200 may acquire the data "DATA" by sampling the data signal DQ at rising and falling edges of the data strobe signal DQS.

The memory interface 200 may transmit a ready/busy output signal nR/B to the memory controller 300 via the eighth pin P18. The memory interface 200 may transmit state information of the memory device 100 to the memory controller 300 via the ready/busy output signal nR/B. In a case in which the memory device 100 is in a busy state (e.g., inner operations of the memory device 100 are being performed), the memory interface 200 may transmit a ready/busy output signal nR/B indicating that the memory device 100 is in the busy state to the memory controller 300. In a case in which the memory device 100 is in a ready state (e.g., internal operations of the memory device 100 are not being performed or have been completed), the memory interface 200 may transmit a ready/busy output signal nR/B indicating that the memory interface 200 is in the ready state to the memory controller 300. For example, when the memory device 100 is reading the data "DATA" from the memory cell array 120 in response to a page read command, the memory interface 200 may transmit the ready/busy output signal nR/B (e.g., a low-level ready/busy output signal nR/B) indicating that the memory device 100 is in the busy state to the memory controller 300. For example, when the memory device 100 is programming the data "DATA" to the memory cell array 120, the memory interface 200 may transmit the ready/busy output signal nR/B (e.g., a low-level ready/busy output signal nR/B) indicating that the memory device 100 is in the busy state to the memory controller 300.

The control logic circuit 110 may control various operations of the memory device 100. The control logic circuit 110 may receive the command CMD or the address ADDR acquired by the memory interface 200. The control logic circuit 110 may generate control signals for controlling the other parts of the memory device 100 in accordance with the command CMD or the address ADDR acquired by the memory interface 200. For example, the control logic circuit 110 may program the data "DATA" to the memory cell array 120 or may generate various control signals for reading the data "DATA" from the memory cell array 120.

The memory cell array 120 may store the data "DATA" acquired by the memory interface 200 under the control of the control logic circuit 110. The memory cell array 120 may output the stored data "DATA" to the memory interface 200 under the control of the control logic circuit 110.

The memory cell array 120 may include a plurality of memory cells. For example, the memory cells may be flash memory cells, but embodiments of the present disclosure are not limited thereto. Alternatively, according to some embodiments, the memory cells may be, for example, resistive random access memory (RRAM) cells, ferroelectric random access memory (FRAM) cells, phase-change random access memory (PRAM) cells, thyristor random access memory (TRAM) cells, magnetic random access memory (MRAM) cells, DRAM cells, double data rate 4 (DDR4) synchronous DRAM (SDRAM) cells, low power DDR4 (LPDDR4) SDRAM cells, or lower power DDR4 (LPDDR5) SDRAM cells.

The memory controller 300 may include first through eighth pins P21 through P28 and a controller interface circuit ("Controller I/F") 310. The first through eighth pins P21 through P28 may correspond to the first through eighth pins P11 through P18, respectively, of the memory device 100.

The controller interface 310 may transmit the chip enable signal nCE to the memory device 100 via the first pin P21. The controller interface 310 may transmit signals to, or receive signals from, the memory device 100 selected by the chip enable signal nCE, via the second through eighth pins P22 through P28.

For example, the controller interface 310 may transmit the command latch enable signal CLE, the address latch enable signal ALE, and the write enable signal nWE to the memory device 100 via the second through fourth pins P22 through P24. The controller interface 310 may transmit the data signal DQ to the memory device 100 to, or receive the data signal DQ from, the memory device 100 via the seventh pin P27.

The controller interface 310 may transmit a data signal DQ including the command CMD or the address ADDR to the memory device 100 together with the write enable signal nWE, which toggles. For example, the controller interface 310 may transmit the data signal DQ including the command CMD in accordance with the transmission of an enabled command latch enable signal CLE and may transmit a data signal DQ including the address ADDR to the memory device 100 in accordance with the transmission of an enabled address latch enable signal ALE.

The controller interface 310 may transmit the write enable signal nRE to the memory device 100 via the fifth pin P25. The controller interface 310 may receive the data strobe signal DQS from, or transmit the data strobe signal DQS to, the memory device 100 via the sixth pin P26.

During the output of the data "DATA" by the memory device 100, the controller interface 310 may generate the write enable signal nRE, which toggles, and may transmit the write enable signal nRE to the memory device 100. For example, the controller interface 310 may generate the write enable signal nRE, which is switched from a static state (e.g., a high level or a low level) to a toggle state before the output of the data "DATA". Accordingly, the memory device 100 may generate the data strobe signal DQS, which toggles, based on the write enable signal nRE. The controller interface 310 may receive the data strobe signal DQS, which toggles, and the data signal DQ including the data "DATA" from the memory device 100. The controller interface 310 may acquire the data "DATA" from the data signal DQ based on the toggle timing of the data strobe signal DQS.

During the input of the data "DATA" by the memory device 100, the controller interface 310 may generate the data strobe signal DQS, which toggles. For example, controller interface 310 may generate a data strobe signal DQS that is switched from a static state (e.g., a high level or a low level) to a toggle state before the transmission of the data "DATA". The controller interface 310 may transmit the data signal DQ including the data "DATA" to the memory device 100 based on the toggle timing of the data strobe signal DQS.

The controller interface 310 may receive the ready/busy output signal nR/B from the memory device 100 via the eighth pin P28. The controller interface 310 may determine the state of the memory device 100 based on the ready/busy output signal nR/B.

The memory device 100 may transmit data through multiple channels via multi-level signaling. Multi-level signaling may be configured to raise the speed of transmitting data without increasing the frequency at and/or the power with which data is transmitted. An example of multi-level signaling may be pulse amplitude modulation (PAM), and unique symbols of a multi-level signal may be configured to represent data of multiple bits. It is assumed that multi-level signaling used by the memory device 100 is PAM. The memory device 100 may use PAM such as, for example, PAM4, PAM8, or PAMN (where N is a natural number greater than 2).

The memory device 100 may transmit more than two pieces of data in each period. For example, the memory device 100 may be a quad data rate (QDR) synchronous memory device capable of inputting/outputting four pieces of data in each period of a system clock. The memory device 100 will hereinafter be described as being a QDR synchronous memory device.

According to a comparative example, to input/output data at rising and falling edges of a system clock, a double data rate (DDR) synchronous memory device may process two pieces of data in each period of the system clock. That is, according to a comparative example, the timing at which a DDR memory device outputs data is synchronized precisely with the rising or falling edge of the system clock. However, a system clock that can be applied to a semiconductor memory device according to such a comparative example may be delayed, phase-changed, or distorted by a clock input buffer or a transmission line (for transmitting a clock signal) in the semiconductor memory device. To address this, a semiconductor memory device according to embodiments of the present disclosure may implement an error correction block(s) therein to transmit precise data in accordance with a plurality of divided clock signals of a system clock.

The memory device 100 according to embodiments of the present disclosure can transmit up to twice as many pieces of data as a DDR synchronous memory device can. The memory device 100, e.g., a QDR synchronous memory device 100, may use two clocks. One of the two clocks may be used as a reference for transmitting commands and addresses for reading or writing data, and the other clock may be used as a reference for transmitting data. Accordingly, the speed of read and write operations of the memory device 100 can become faster.

According to some embodiments, to precisely input or output four pieces of data in each period of a system clock, the memory device 100 precisely synchronizes the data with the 0-, 90-, 180-, and 270-degree phases of the system clock. That is, the memory device 100 outputs one piece of data at every 90 degrees. Thus, according to some embodiments, data is synchronized with the phase of the system clock more precisely, the valid window for the operation of the memory device 100 is more secured, and the reliability of the operation of the memory device 100 may be increased. To increase the reliability of the operation of the memory device 100, error correction blocks may be arranged at log 2N data paths that can be generated when using PAMN (where N is a natural number greater than 2). For example, the error correction blocks may be arranged at the log 2N data paths, in the memory interface 200, and this will hereinafter be described.

Figure 4:
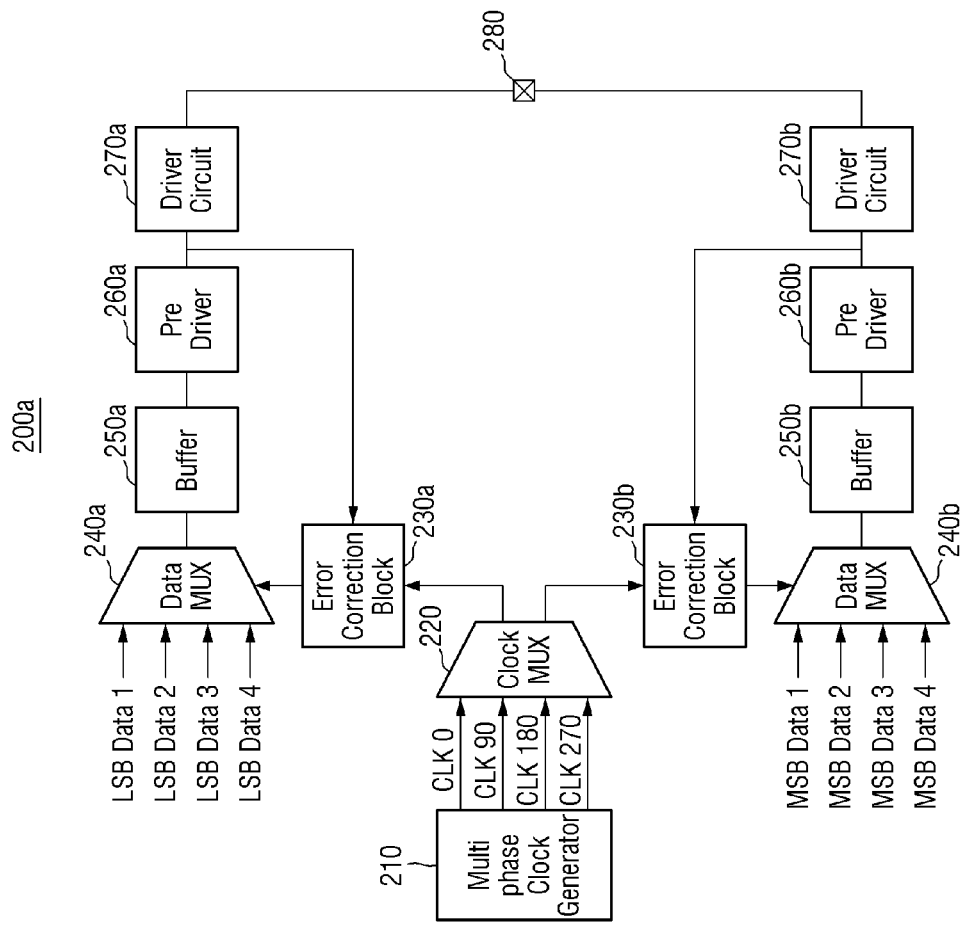
FIG. 4 is a block diagram of a memory interface of a memory device according to some embodiments of the present disclosure.

FIG. 4 is a block diagram of a memory interface of a memory device according to some embodiments of the present disclosure.

Referring to FIG. 4, a memory interface 200a may include a multiphase clock generator 210 (which may also be referred to as a multiphase clock generator circuit), a clock multiplexer ("Clock MUX") 220 (which may also be referred to as a clock multiplexer circuit), error correction blocks 230a and 230b (which may also be referred to as error correction circuits), which are arranged at data paths, data multiplexers ("Data MUX") 240a and 240b (which may also be referred to as data multiplexer circuits), buffers 250a and 250b (which may also be referred to as buffer circuits), pre-drivers 260a and 260b (which may also be referred to as pre-driver circuits), driver circuits 270a and 270b, and an input/output pad 280. The memory interface 200a will hereinafter be described as using, for example, PAM4.

The error correction blocks 230a and 230b, the buffers 250a and 250b, the pre-drivers 260a and 260b, and the driver circuits 270a and 270b may be arranged at their respective data paths, but embodiments of the present disclosure are not limited thereto. For example, according to some embodiments, a different configuration of the memory interface 200a may be utilized, as long as data can be properly fed back to each of the error correction blocks 230a and 230b via each data path.

The multiphase CK generator 210 may receive a reference clock signal and may generate a plurality of divided clock signals (e.g., first, second, third, and fourth divided clock signals "CLK 0", "CLK 90", "CLK 180", and "CLK 270") having a 90-degree phase difference from one another by dividing the reference clock signal.

The clock multiplexer 220 may receive the first, second, third, and fourth divided clock signals "CLK 0", "CLK 90", "CLK 180", and "CLK 270" from the multiphase clock generator 210. The clock multiplexer 220 may select at least one of the first, second, third, and fourth divided clock signals "CLK 0", "CLK 90", "CLK 180", and "CLK 270" and may transmit the selected divided clock signal to the first and second error correction blocks 230a and 230b. For convenience of explanation, it is assumed that the clock multiplexer 220 transmits the first divided clock signal "CLK 0" to the first and second and error correction blocks 230a and 230b.

The first error correction block 230a may include a duty cycle correction (DCC) circuit for correcting any duty ratio distortion caused by a phase change or distortion in the first divided clock signal "CLK 0". The DCC circuit may be used to correct the duty ratio of a clock signal input to, or output from, the first error correction block 230a or the duty ratio of a clock signal to be delivered to the inside or the outside of, for example, the memory device 100 of FIG. 3.

The first error correction block 230a may further include a quadrature error correction (QEC) circuit. The QEC circuit may receive multiple pieces of least significant bit (LSB) data (e.g., first, second, third, and fourth LSB data "LSB Data 1", "LSB Data 2", "LSB Data 3", and "LSB Data 4") transmitted via a first data path including the first error correction block 230a, a first data multiplexer 240a, a first buffer 250a, a first pre-driver 260a, and the first driver circuit 270a, may correct the toggle times of the multiple pieces of LSB data, and may make the eye diagram or window sizes of the multiple pieces of LSB data and multiple pieces of most significant bit (MSB) data (e.g., first, second, third, and fourth MSB data "MSB Data 1", "MSB Data 2", "MSB Data 3", and "MSB Data 4") transmitted via a second data path be identical. This will be described later in detail.

The first data multiplexer 240a may receive the first divided clock signal "CLK 0" from the first error correction block 230a and may transmit LSB data corresponding to the first divided clock signal "CLK 0" to the first buffer 250a. It is assumed that the LSB data transmitted by the first data multiplexer 240a to the first buffer 250a is the first LSB data "LSB Data 1".

The first buffer 250a may include, for example, a first input/first output (FIFO) component. For example, the multiple pieces of LSB data (e.g., the first, second, third, and fourth LSB data "LSB Data 1", "LSB Data 2", "LSB Data 3", and "LSB Data 4") transmitted from the first data multiplexer 240a to the first buffer 250a may be routed via the first buffer 250a. The first buffer 250a may process data in accordance with the input times and priority levels of the multiple pieces of LSB data (e.g., the first, second, third, and fourth LSB data "LSB Data 1", "LSB Data 2", "LSB Data 3", and "LSB Data 4"). For example, the first buffer 250a may process data that comes first first (e.g., in a FIFO manner).

The first LSB data "LSB Data 1" may be transmitted to the first pre-driver 260a via the first buffer 250a. The first pre-driver 260a may be, for example, a biasing circuit for generating a low-power signal.

The first LSB data "LSB Data 1" may be transmitted to the first driver circuit 270a via the first pre-driver 260a. The first driver circuit 270a may include, for example, a pull-up circuit or a pull-down circuit. That is, the first LSB data "LSB Data 1" may be pulled up or down to a desired amplitude level via the first pre-driver 260a and may then be output to the input/output pad 280.

The first LSB data "LSB Data 1" may be transmitted to outside of the memory interface 200a (e.g., the controller interface 310 of FIG. 3) via the input/output pad 280.

In the memory interface 200a, the first error correction block 230a may receive the first LSB data "LSB Data 1". Then, the first error correction block 230a may correct the toggle time of the first LSB data "LSB Data 1", and may thus make the eye diagram or window sizes of the first LSB data "LSB Data 1" and MSB data (e.g., first MSB data "MSB Data 1") that toggles in response to the first divided clock signal "CLK 0" be identical. This will hereinafter be described in detail.

The above description of the first data path may be directly applicable to a second data path along which MSB data is transmitted via a second error correction block 230b, a second data multiplexer 240b, a second buffer 250b, a second pre-driver 260b, and a second driver circuit 270b, and thus, for convenience of explanation, a detailed description of the second data path will be omitted.

The toggling times of multiple pieces of data that will hereinafter be described are given as an example, and embodiments of the present disclosure are not limited thereto.

Figure 5:
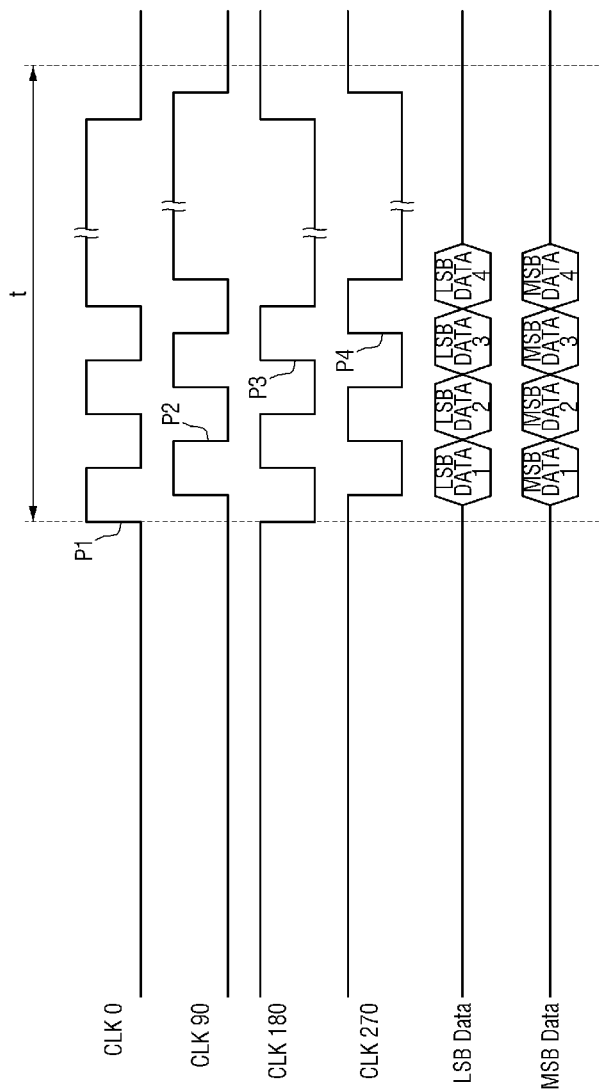
FIG. 5 is a timing diagram illustrating a read operation of the memory device of FIG. 3 according to some embodiments of the present disclosure.

FIG. 5 is a timing diagram illustrating a read operation of the memory device of FIG. 3 according to some embodiments of the present disclosure.

FIGS. 3 through 5 illustrate control signals (e.g., the first, second, third, and fourth divided clock signals "CLK 0", "CLK 90", "CLK 180", and "CLK 270") provided internally within the memory device 100 for the controller interface 310 to read data from the memory device 100, and multiple pieces of data (e.g., the first, second, third, and fourth LSB data "LSB Data 1", "LSB Data 2", "LSB Data 3", and "LSB Data 4" and the first, second, third, and fourth MSB data "MSB Data 1", "MSB Data 2", "MSB Data 3", and "MSB Data 4") output by the memory device 100.

The memory device 100 may output data read from the memory cell array 120 for a period of time t to outside of the memory device 100 (e.g., to the memory controller 300). The controller interface 310 may toggle a read enable signal. The read enable signal may correspond to the read enable signal nRE of FIG. 3. When the read enable signal toggles, data can be read from the memory cell array 120.

For example, the first LSB data "LSB Data 1" and the first MSB data "MSB Data 1", which correspond to the first divided clock signal "CLK 0", may be extracted from the memory cell array 120 after a rising edge p1 of the first divided clock signal "CLK 0". The second LSB data "LSB Data 2" and the second MSB data "MSB Data 2", which correspond to the second divided clock signal "CLK 90", may be extracted from the memory cell array 120 after a falling edge p2 of the second divided clock signal "CLK 90". The third LSB data "LSB Data 3" and the third MSB data "MSB Data 3", which correspond to the third divided clock signal "CLK 180", may be extracted from the memory cell array 120 after a rising edge p3 of the third divided clock signal "CLK 180". The fourth LSB data "LSB Data 4" and the fourth MSB data "MSB Data 4", which correspond to the fourth divided clock signal "CLK 270", may be extracted from the memory cell array 120 after a rising edge p4 of the fourth divided clock signal "CLK 270".

That is, the toggle times of the multiple pieces of LSB data (e.g., the first, second, third, and fourth LSB data "LSB Data 1", "LSB Data 2", "LSB Data 3", and "LSB Data 4") transmitted via the first data path and the multiple pieces of MSB data (e.g., the first, second, third, and fourth MSB data "MSB Data 1", "MSB Data 2", "MSB Data 3", and "MSB Data 4") transmitted via the second data path may be adjusted via the first and second error correction blocks 230a and 230b, which are arranged at the first and second data paths, respectively, and as a result, the eye diagram or window sizes of the multiple pieces of LSB data and the multiple pieces of MSB data may become identical to a maximum size. For example, as the first error correction block 230a, which is arranged at the first data path, receives the first LSB data "LSB Data 1" and corrects the timing of transmitting the first LSB data "LSB Data 1", and the second error correction block 230b, which is arranged at the second data path, receives the first MSB data "MSB Data 1" and corrects the timing of transmitting the first MSB data "MSB Data 1", the eye diagram or window sizes of the first LSB data "LSB Data 1" and the first MSB data "MSB Data 1", which correspond to the first divided clock signal "CLK 0", may become identical to the maximum size.

As the first error correction block 230a, which is arranged at the first data path, receives the second LSB data "LSB Data 2" and corrects the timing of transmitting the second LSB data "LSB Data 2", and the second error correction block 230b, which is arranged at the second data path, receives the second MSB data "MSB Data 2" and corrects the timing of transmitting the second MSB data "MSB Data 2", the eye diagram or window sizes of the second LSB data "LSB Data 2" and the second MSB data "MSB Data 2", which correspond to the second divided clock signal "CLK 90", may become identical to the maximum size.

As the first error correction block 230a, which is arranged at the first data path, receives the third LSB data "LSB Data 3" and corrects the timing of transmitting the third LSB data "LSB Data 3", and the second error correction block 230b, which is arranged at the second data path, receives the third MSB data "MSB Data 3" and corrects the timing of transmitting the third MSB data "MSB Data 3", the eye diagram or window sizes of the third LSB data "LSB Data 3" and the third MSB data "MSB Data 3", which correspond to the third divided clock signal "CLK 180", may become identical to the maximum size.

As the first error correction block 230a, which is arranged at the first data path, receives the fourth LSB data "LSB Data 4" and corrects the timing of transmitting the fourth LSB data "LSB Data 4", and the second error correction block 230b, which is arranged at the second data path, receives the fourth MSB data "MSB Data 4" and corrects the timing of transmitting the fourth MSB data "MSB Data 4", the eye diagram or window sizes of the fourth LSB data "LSB Data 4" and the fourth MSB data "MSB Data 4", which correspond to the fourth divided clock signal "CLK 270", may become identical to the maximum size.

Figure 6:
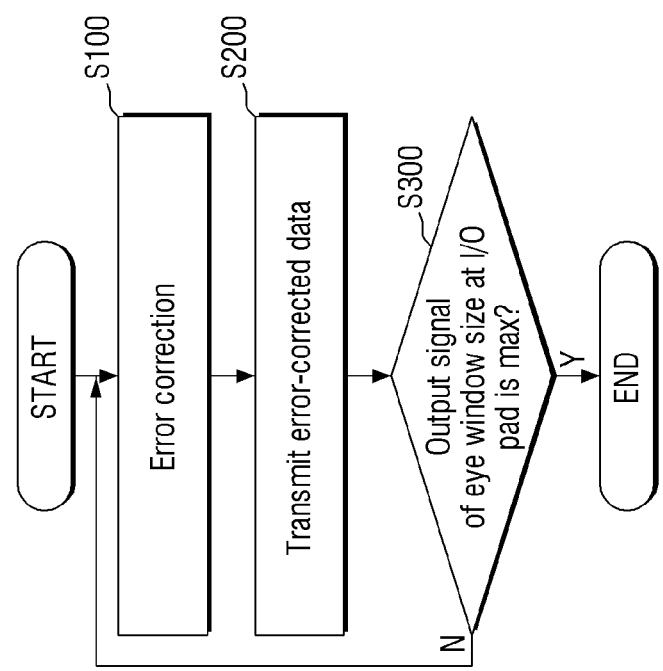
FIG. 6 is a flowchart illustrating an operation of the memory device of FIG. 3 according to some embodiments of the present disclosure.

FIG. 6 is a flowchart illustrating an operation of the memory device of FIG. 3 according to some embodiments of the present disclosure.

Referring to FIGS. 3, 4, and 6, in each of the first and second error correction blocks 230a and 230b of the memory device 1, error correction is performed on LSB data (e.g., the first, second, third, or fourth LSB data "LSB Data 1", "LSB Data 2", "LSB Data 3", or "LSB Data 4") and MSB data (e.g., the first, second, third, or fourth MSB data "MSB Data 1", "MSB Data 2", "MSB Data 3", or "MSB Data 4") (S100).

The error correction may be DCC and/or QEC.

In each of the first and second error correction blocks 230a and 230b, the error-corrected LSB data (e.g., the first, second, third, or fourth LSB data "LSB Data 1", "LSB Data 2", "LSB Data 3", or "LSB Data 4") and the error-corrected MSB data (e.g., the first, second, third, or fourth MSB data "MSB Data 1", "MSB Data 2", "MSB Data 3", or "MSB Data 4") are transmitted via their respective data paths (S200).

Thereafter, a determination is made as to whether the eye window size of data into which the eye window sizes of the LSB data (e.g., the first, second, third, or fourth LSB data "LSB Data 1", "LSB Data 2", "LSB Data 3", or "LSB Data 4") and the MSB data (e.g., the first, second, third, or fourth MSB data "MSB Data 1", "MSB Data 2", "MSB Data 3", or "MSB Data 4") that are error-corrected by the first and second error correction block 230a or 230b and are combined at and output from the input/output pad 280 amounts to a maximum size (S300).

If a determination is made that the eye window sizes of the LSB data (e.g., the first, second, third, or fourth LSB data "LSB Data 1", "LSB Data 2", "LSB Data 3", or "LSB Data 4") and the MSB data (e.g., the first, second, third, or fourth MSB data "MSB Data 1", "MSB Data 2", "MSB Data 3", or "MSB Data 4") that are error-corrected by the first and second error correction block 230a or 230b, respectively, and are combined at and output from the input/output pad 280 amounts to the maximum size ("Y"), the feedback of LSB data and MSB data is stopped, and the LSB data (e.g., the first, second, third, or fourth LSB data "LSB Data 1", "LSB Data 2", "LSB Data 3", or "LSB Data 4") and the MSB data (e.g., the first, second, third, or fourth MSB data "MSB Data 1", "MSB Data 2", "MSB Data 3", or "MSB Data 4") are transmitted via the input/output pad 280.

On the contrary, if a determination is made that the eye window sizes of the LSB data (e.g., the first, second, third, or fourth LSB data "LSB Data 1", "LSB Data 2", "LSB Data 3", or "LSB Data 4") and the MSB data (e.g., the first, second, third, or fourth MSB data "MSB Data 1", "MSB Data 2", "MSB Data 3", or "MSB Data 4") that are error-corrected by the first and second error correction block 230a or 230b, respectively, and are combined at and output from the input/output pad 280 does not amount to the maximum size ("N"), the first and second error correction blocks 230a and 230b may perform error correction again on the LSB data (e.g., the first, second, third, or fourth LSB data "LSB Data 1", "LSB Data 2", "LSB Data 3", or "LSB Data 4") and the MSB data (e.g., the first, second, third, or fourth MSB data "MSB Data 1", "MSB Data 2", "MSB Data 3", or "MSB Data 4"), respectively (S100).

Figure 7:
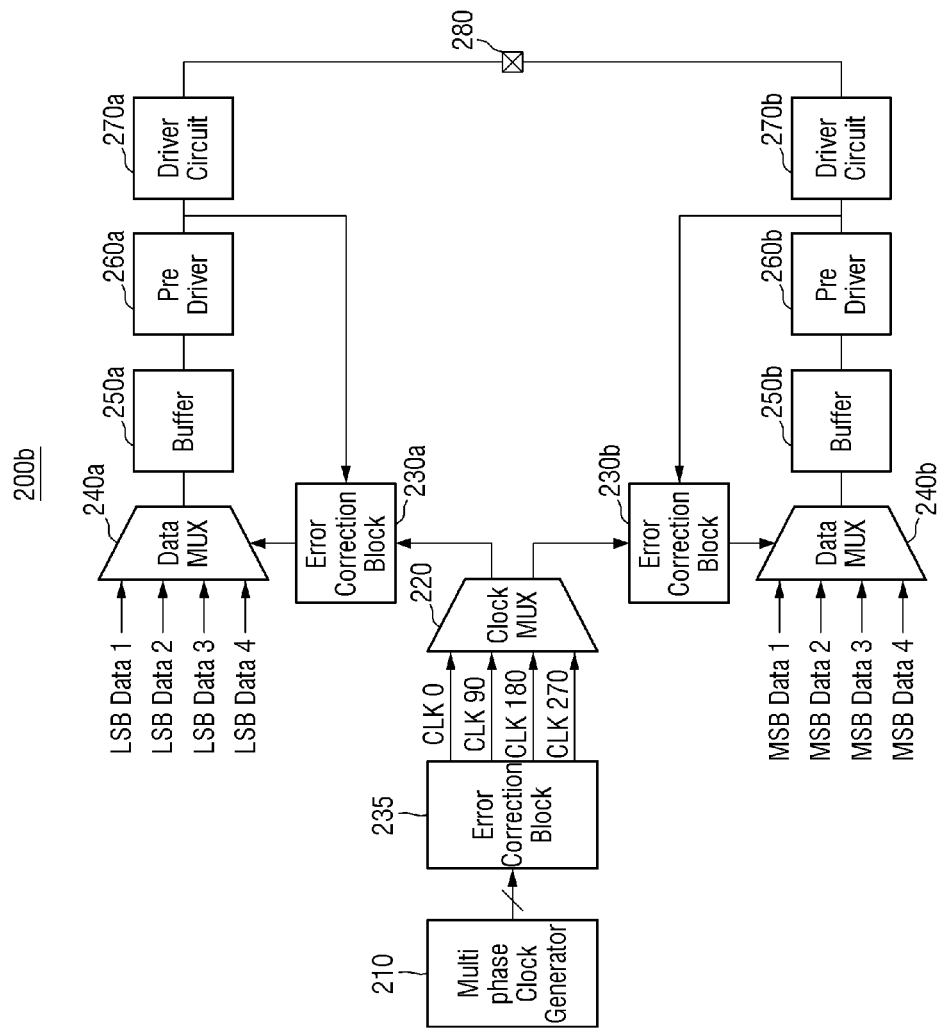
FIGS. 7 and 8 are block diagrams of the interfaces of memory devices according to some embodiments of the present disclosure.
Figure 8:
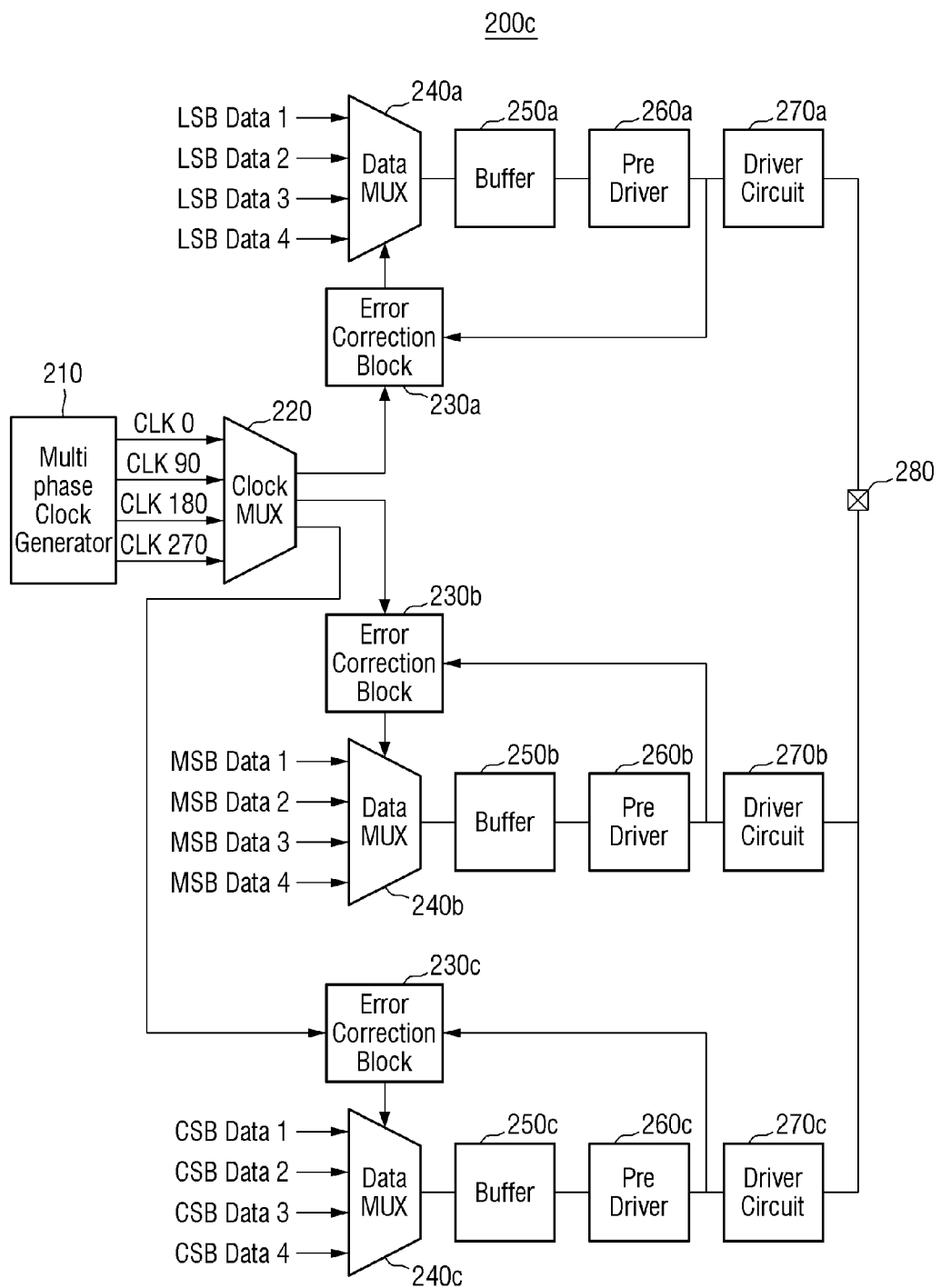

FIGS. 7 and 8 are block diagrams of the interfaces of memory devices according to some embodiments of the present disclosure. For convenience of explanation, the description of the embodiments of FIGS. 7 and 8 will focus mainly on the differences from the embodiment of FIG. 4, and a further description of components and technical aspects previously described may be omitted.

Referring to FIG. 7, a memory interface 200b, unlike the memory interface 200a of FIG. 4, may further include a third error correction block 235, which is connected between a multiphase clock generator 210 and a clock multiplexer 220.

The third error correction block 235 may include a DCC circuit for correcting any duty ratio distortion caused by a phase change or distortion in each divided clock signal (e.g., a first, second, third, or fourth divided clock signal "CLK 0", "CLK 90", "CLK 180", or "CLK 270") received from the multiphase clock generator 210. The DCC circuit may be used to0 correct the duty ratio of a clock signal input to the clock multiplexer 220 or the duty ratio of a clock signal to be delivered to the inside or the outside of, for example, the memory device 100 of FIG. 3.

Referring to FIG. 8, a memory interface 200c, unlike the memory interface 200a of FIG. 4, may use PAM8.

That is, the memory interface 200c, unlike the memory interface 200a of FIG. 4, may include one additional data path.

The additional data path may include a third error correction block 230c, a third data multiplexer 240c, a third buffer 250c, a third pre-driver 260c, a third driver circuit 270c, and an input/output pad 280. The additional data path is substantially the same as the data paths of FIG. 4, and thus, a further detailed description thereof will be omitted.

Other features of the memory device of FIG. 8 are substantially the same as their respective counterparts of the memory device of FIG. 4, and thus, a further detailed description thereof will be omitted.

Figure 9:
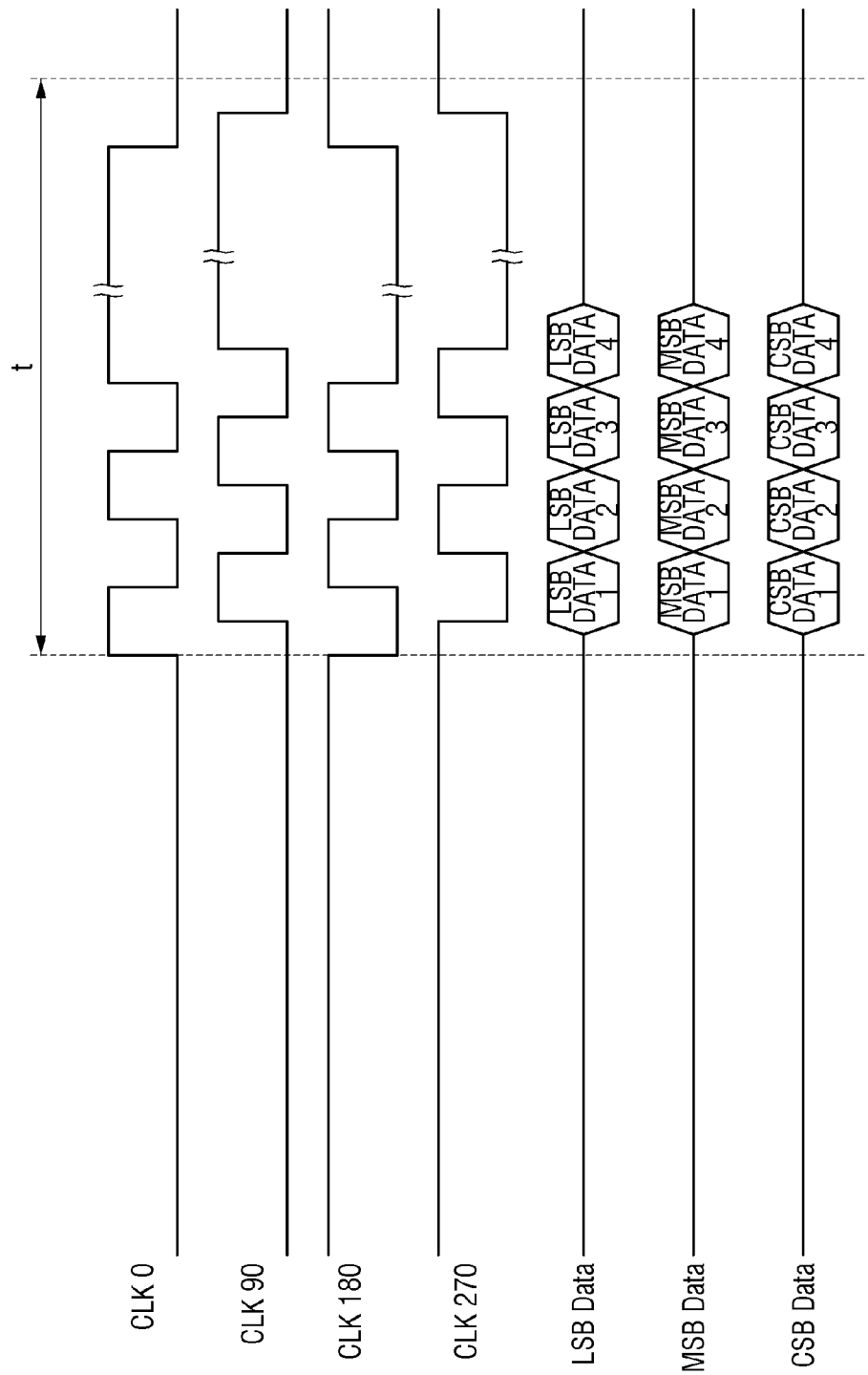
FIG. 9 is a timing diagram illustrating a read operation of the memory device of FIG. 8 according to some embodiments of the present disclosure.

FIG. 9 is a timing diagram illustrating a read operation of the memory device of FIG. 8 according to some embodiments of the present disclosure.

Referring to FIGS. 8 and 9, the toggle times of multiple pieces of LSB data (e.g., the first, second, third, and fourth LSB data "LSB Data 1", "LSB Data 2", "LSB Data 3", and "LSB Data 4") transmitted via a first data path, multiple pieces of MSB data (e.g., first, second, third, and fourth MSB data "MSB Data 1", "MSB Data 2", "MSB Data 3", and "MSB Data 4") transmitted via a second data path, and multiple pieces of central significant bit (CSB) data (e.g., first, second, third, and fourth CSB data "CSB Data 1", "CSB Data 2", "CSB Data 3", and "CSB Data 4") transmitted via the third data path may be adjusted via first, second, and third error correction blocks 230a, 230b, and 230c, which are arranged at the first, second, and third data paths, respectively. As a result, the eye diagram or window sizes of the multiple pieces of LSB data, the multiple pieces of MSB data, and the multiple pieces of CSB data may become identical to a maximum size.

For example, as the first error correction block 230*a*, which is arranged at the first data path, receives the first LSB data "LSB Data 1" and corrects the timing of transmitting the first LSB data "LSB Data 1", the second error correction block 230*b*, which is arranged at the second data path, receives the first MSB data "MSB Data 1" and corrects the timing of transmitting the first MSB data "MSB Data 1", and the third error correction block 230*c*, which is arranged at the third data path, receives the first CSB data "CSB Data 1" and corrects the timing of transmitting the first CSB data "CSB Data 1", the eye diagram or window sizes of the first LSB data "LSB Data 1", the first MSB data "MSB Data 1", and the first CSB data "CSB Data 1", which correspond to the first divided clock signal "CLK 0", may become identical to the maximum size.

As the first error correction block 230*a*, which is arranged at the first data path, receives the second LSB data "LSB Data 2" and corrects the timing of transmitting the second LSB data "LSB Data 2", the second error correction block 230*b*, which is arranged at the second data path, receives the second MSB data "MSB Data 2" and corrects the timing of transmitting the second MSB data "MSB Data 2", and the third error correction block 230*c*, which is arranged at the third data path, receives the second CSB data "CSB Data 2" and corrects the timing of transmitting the second CSB data "CSB Data 2", the eye diagram or window sizes of the second LSB data "LSB Data 2", the second MSB data "MSB Data 2", and the second CSB data "CSB Data 2", which correspond to the second divided clock signal "CLK 90", may become identical to the maximum size.

As the first error correction block 230*a*, which is arranged at the first data path, receives the third LSB data "LSB Data 3" and corrects the timing of transmitting the third LSB data "LSB Data 3", the second error correction block 230*b*, which is arranged at the second data path, receives the third MSB data "MSB Data 3" and corrects the timing of transmitting the third MSB data "MSB Data 3", and the third error correction block 230*c*, which is arranged at the third data path, receives the third CSB data "CSB Data 3" and corrects the timing of transmitting the third CSB data "CSB Data 3", the eye diagram or window sizes of the third LSB data "LSB Data 3", the third MSB data "MSB Data 3", and the third CSB data "CSB Data 3", which correspond to the third divided clock signal "CLK 180", may become identical to the maximum size.

As the first error correction block 230*a*, which is arranged at the first data path, receives the fourth LSB data "LSB Data 4" and corrects the timing of transmitting the fourth LSB data "LSB Data 4", the second error correction block 230*b*, which is arranged at the second data path, receives the fourth MSB data "MSB Data 4" and corrects the timing of transmitting the fourth MSB data "MSB Data 4", and the third error correction block 230*c*, which is arranged at the third data path, receives the fourth CSB data "CSB Data 4" and corrects the timing of transmitting the fourth CSB data "CSB Data 4", the eye diagram or window sizes of the fourth LSB data "LSB Data 4", the fourth MSB data "MSB Data 4", and the fourth CSB data "CSB Data 4", which correspond to the fourth divided clock signal "CLK 270", may become identical to the maximum size.

Other features of the read operation of the memory device of FIG. 8 are substantially the same as their respective counterparts of the read operation of the memory device of FIG. 4, and thus, a further detailed description thereof will be omitted.

Figure 10:
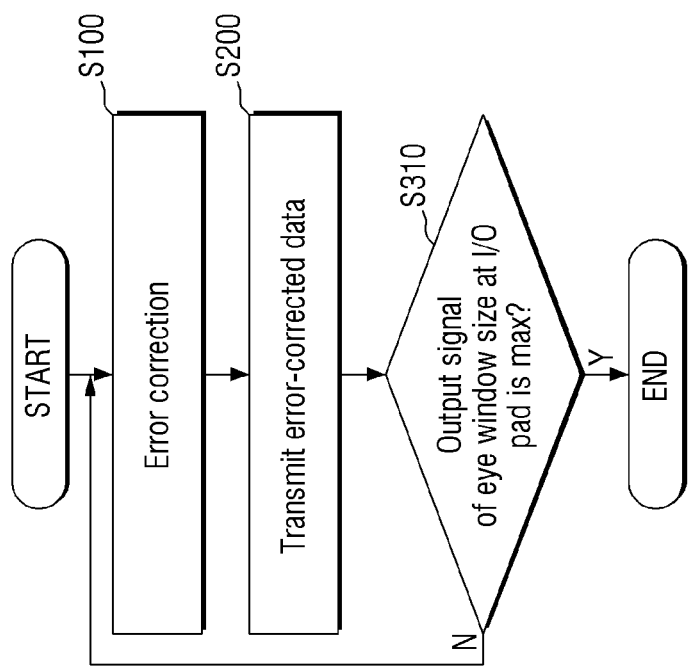
FIG. 10 is a flowchart illustrating an operation of the memory device of FIG. 8 according to some embodiments of the present disclosure.

FIG. 10 is a flowchart illustrating an operation of the memory device of FIG. 8 according to some embodiments of the present disclosure.

The embodiment of FIG. 10 differs from the embodiment of FIG. 6 in that a determination is made as to whether the eye window size of data into which the eye window sizes of LSB data (e.g., the first, second, third, or fourth LSB data "LSB Data 1", "LSB Data 2", "LSB Data 3", or "LSB Data 4"), MSB data (e.g., the first, second, third, or fourth MSB data "MSB Data 1", "MSB Data 2", "MSB Data 3", or "MSB Data 4"), and CSB data (e.g., first, second, third, or fourth CSB data "CSB Data 1", "CSB Data 2", "CSB Data 3", or "CSB Data 4") that are error-corrected by the first, second, and third error correction block 230*a*, 230*b*, or 230*c*, respectively, and are combined at and output from the input/output pad 280, amounts to a maximum size (S310).

Referring to FIG. 10, if a determination is made that the eye window sizes of the LSB data (e.g., the first, second, third, or fourth LSB data "LSB Data 1", "LSB Data 2", "LSB Data 3", or "LSB Data 4"), the MSB data (e.g., the first, second, third, or fourth MSB data "MSB Data 1", "MSB Data 2", "MSB Data 3", or "MSB Data 4"), and the CSB data (e.g., first, second, third, or fourth CSB data "CSB Data 1", "CSB Data 2", "CSB Data 3", or "CSB Data 4") that are error-corrected by the first, second, and third error correction block 230*a*, 230*b*, or 230*c*, respectively, and are combined at and output from the input/output pad 280 amounts to the maximum size ("Y"), the feedback of LSB data and MSB data is stopped, and the LSB data (e.g., the first, second, third, or fourth LSB data "LSB Data 1", "LSB Data 2", "LSB Data 3", or "LSB Data 4") and the MSB data (e.g., the first, second, third, or fourth MSB data "MSB Data 1", "MSB Data 2", "MSB Data 3", or "MSB Data 4") are transmitted via the input/output pad 280.

On the contrary, if a determination is made that the eye window sizes of the LSB data (e.g., the first, second, third, or fourth LSB data "LSB Data 1", "LSB Data 2", "LSB Data 3", or "LSB Data 4"), the MSB data (e.g., the first, second, third, or fourth MSB data "MSB Data 1", "MSB Data 2", "MSB Data 3", or "MSB Data 4"), and the CSB data (e.g., first, second, third, or fourth CSB data "CSB Data 1", "CSB Data 2", "CSB Data 3", or "CSB Data 4") that are error-corrected by the first, second, and third error correction block 230*a*, 230*b*, or 230*c*, respectively, and are combined at and output from the input/output pad 280 does not amount to the maximum size ("N"), the first, second, and third error correction blocks 230*a*, 230*b*, and 230*c* may perform error correction again on the LSB data (e.g., the first, second, third, or fourth LSB data "LSB Data 1", "LSB Data 2", "LSB Data 3", or "LSB Data 4"), the MSB data (e.g., the first, second, third, or fourth MSB data "MSB Data 1", "MSB Data 2", "MSB Data 3", or "MSB Data 4"), and the CSB data (e.g., first, second, third, or fourth CSB data "CSB Data 1", "CSB Data 2", "CSB Data 3", or "CSB Data 4"), respectively (S100).

Figure 11:
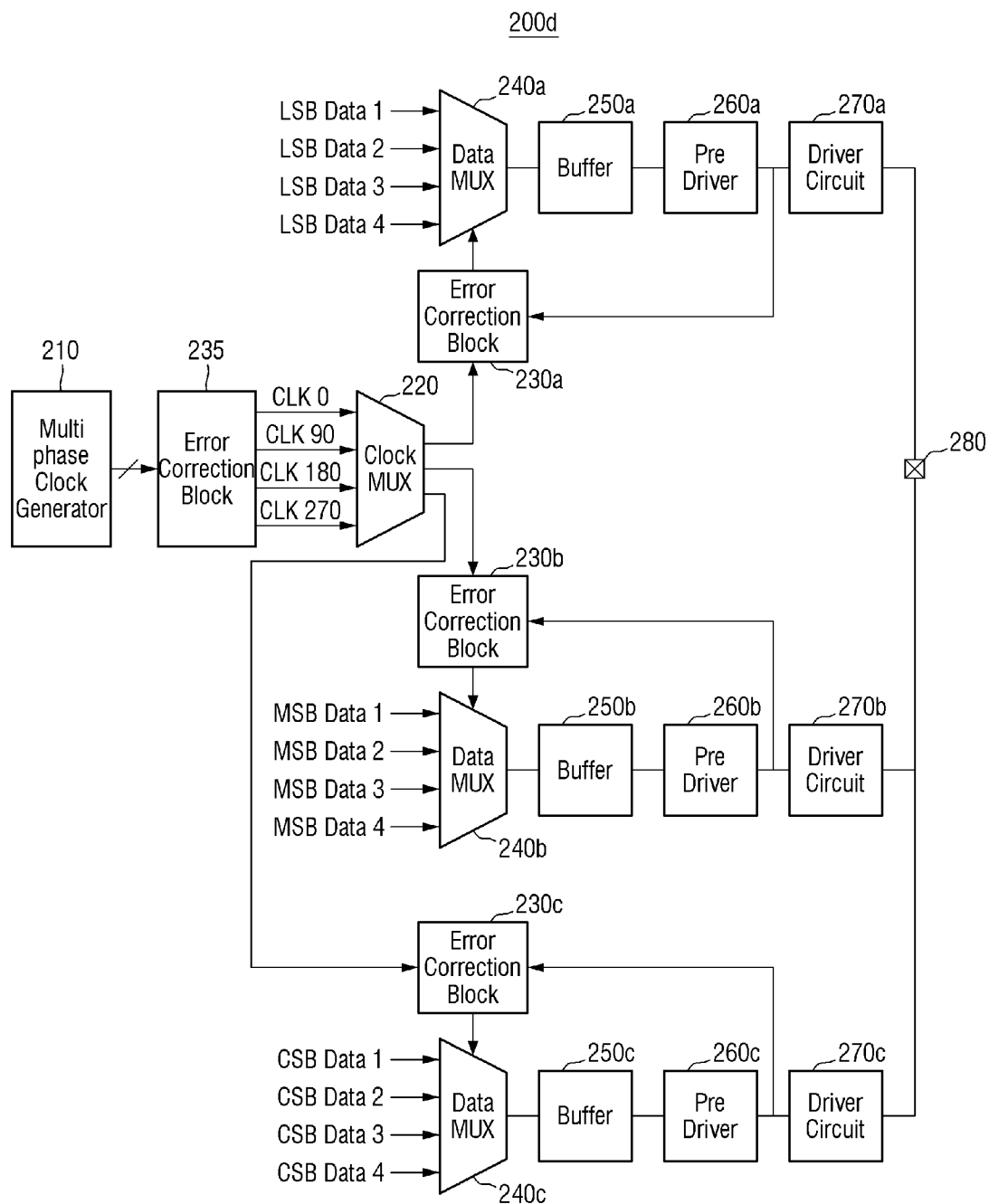
FIG. 11 is a block diagram of a memory interface of a memory device according to some embodiments of the present disclosure.

FIG. 11 is a block diagram of a memory interface of a memory device according to some embodiments of the present disclosure.

Referring to FIG. 11, a memory interface 200*d*, like the memory interface 200*b* of FIG. 7, may further include a third error correction block 235, which is connected between a multiphase clock generator 210 and a clock multiplexer 220.

Other features of the embodiment of FIG. 11 are substantially the same as their respective counterparts of the embodiments of FIGS. 7 and 8, and thus, for convenience of explanation, a further detailed description of components and technical aspects will be omitted.

Figure 12:
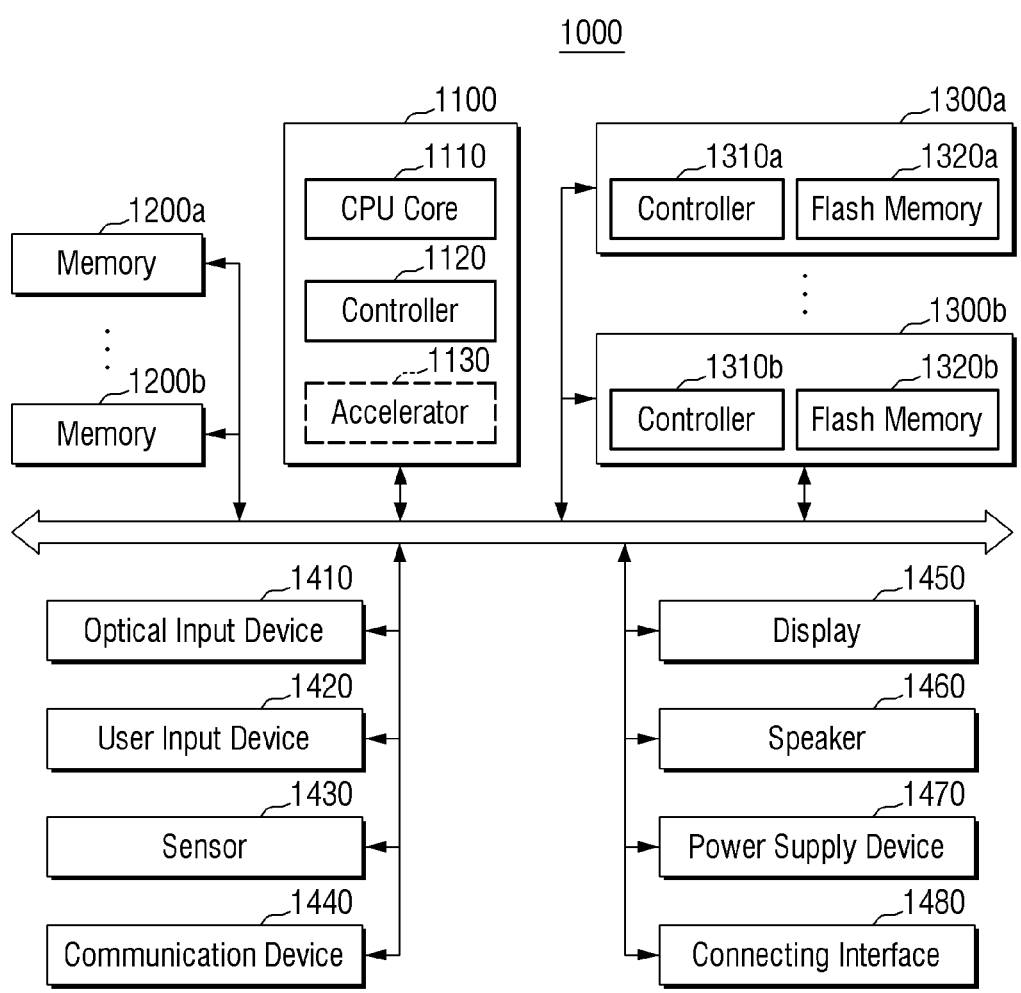
FIG. 12 is a block diagram of a memory system to which a memory device according to some embodiments of the present disclosure is applied.

FIG. 12 is a block diagram of a memory system to which a memory device according to some embodiments of the present disclosure is applied.

Referring to FIG. 12, a memory system 1000 may be a mobile system such as, for example, a mobile communication terminal (e.g., a mobile phone, a smartphone, or a tablet personal computer (PC)), a wearable device, a healthcare device, or an Internet-of-Things (IoT) device, but embodiments of the present disclosure are not limited thereto. Alternatively, the memory system 1000 may be a PC, a laptop computer, a server, a media player, or an automotive device such as a navigation device.

The memory system 1000 may include a main processor ("CPU Core") 1100, memories 1200a and 1200b, and storage devices 1300a and 1300b, and may further include at least one of an optical input device 1410, a user input device 1420, a sensor 1430, a communication device 1440, a display 1450, a speaker 1460, a power supply device 1470, and a connecting interface 1480.

The main processor 1100 may control the general operation of the memory system 1000, particularly, the operations of the elements of the memory system 1000. The main processor 1100 may be implemented as, for example, a general-purpose processor, a dedicated processor, or an application processor.

The main processor 1100 may include one or more CPU cores 1110 and may further include a controller 1120 for controlling the memories 1200a and 1200b and/or the storage devices 1300a and 1300b. In some embodiments, the main processor 1100 may further include an accelerator block ("Accelerator") 1130, which may be implemented to perform a high-speed data operation such as an artificial intelligence (AI) data operation. The accelerator block 1130 may include, for example, a graphics processing unit (GPU), a neural processing unit (NPU), and/or a data processing unit (DPU), and may be implemented as a physically separate chip from the other elements of the main processor 1100.

The memories 1200a and 1200b may be used as main memories for the memory system 1000 and may include nonvolatile memories such as, for example, static random access memories (SRAMs) and/or dynamic random access memories (DRAMs). Alternatively, the memories 1200a and 1200b may include nonvolatile memories such as, for example, flash memories, phase-change random access memories (PRAMs), and/or resistive random access memories RRAMs. The memories 1200a and 1200b may be implemented in the same package as the main processor 1100.

The storage devices 1300a and 1300b may function as nonvolatile storage devices that store data without regard to whether power is supplied thereto, and may have a larger storage capacity than the memories 1200a and 1200b. The storage devices 1300a and 1300b may include storage controllers 1310a and 1310b and nonvolatile memory (NVM) storage devices 1320a and 1320b, which store data under the control of the storage controllers 1310a and 1310b. The NVM storage devices 1320a and 1320b may include, for example, two-dimensional (2D) or three-dimensional (3D) V-NAND flash memories, or other nonvolatile memories such as PRAMs and/or RRAMs.

The storage devices 1300a and 1300b may be included in the memory system 1000 as separate elements from the main processor 1100 or may be implemented in the same package as the main processor 1100. The storage devices 1300a and 1300b may be in the form of memory cards, and may thus be detachably coupled to the other elements of the memory system 1000 via an interface such as the connecting interface 1480. The storage devices 1300a and 1300b may be devices to which standards such as Universal Flash Storage (UFS) are applied, but embodiments of the present disclosure are not limited thereto.

The optical input device 1410 may capture a still or moving image and may be, for example, a camera, a camcorder, and/or a webcam.

The user input device 1420 may receive various types of data from a user and may be, for example, a touchpad, a keypad, a keyboard, a mouse and/or a microphone.

The sensor 1430 may detect various types of physical quantities that can be measured from outside the memory system 1000, and may convert the detected physical quantities into electrical signals. The sensor 1430 may be, for example, a temperature sensor, a pressure sensor, an illuminance sensor, a position sensor, an acceleration sensor, a biosensor, and/or a gyroscope.

The communication device 1440 may transmit signals to, or receive signals from, other devices outside the memory system 1000 in accordance with various communication standards. The communication device 1440 may be implemented as, for example, an antenna, a transceiver and/or a modem.

The display 1450 and the speaker 1460 may function as output devices for outputting visual information and audible information to the user.

The power supply device 1470 may appropriately convert power from a battery embedded in the memory system 1000 or from an external power source, and may supply the power to the other elements of the memory system 1000.

The connecting interface 1480 may provide a connection between the memory system 1000 and an external device that can be connected to the memory system 1000 to exchange data with the memory system 1000. The connecting interface 1480 may be implemented as, for example, an Advanced Technology Attachment (ATA) interface, a Serial ATA (SATA) interface, an external SATA (e-SATA) interface, a Small Computer Small Interface (SCSI) interface, a Serial Attached SCSI (SAS) interface, a Peripheral Component Interconnection (PCI) interface, a PCI express (PCIe) interface, an NVM express (NVMe) interface, an IEEE 1394 interface, a universal serial bus (USB) interface, a secure digital (SD) card interface, a multi-media card (MMC) interface, an embedded multi-media card (eMMC) interface, a UFS interface, an embedded UFS (eUFS) interface, or a compact flash (CF) interface. The connecting interface 1480 may be any one of the memory interfaces described above with reference to FIGS. 1 through 11.

Figure 13:
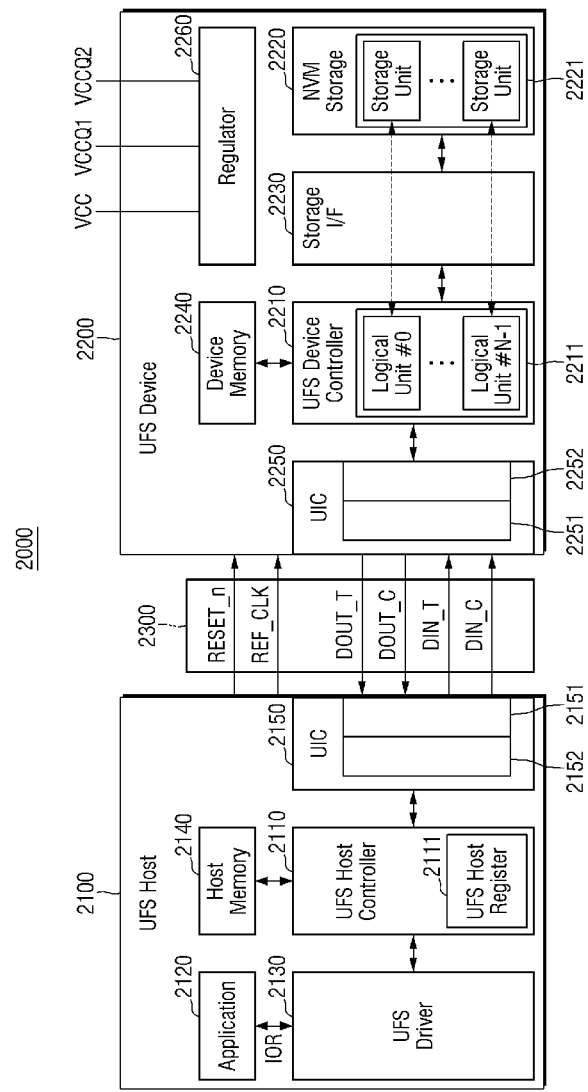
FIG. 13 is a block diagram of a Universal Flash Storage (UFS) system to which a memory device according to some embodiments of the present disclosure is applied.

FIG. 13 is a block diagram of a UFS system to which a memory device according to some embodiments of the present disclosure is applied.

FIG. 13 illustrates a UFS system 2000 that conforms to the UFS standard published by the Joint Electron Device Engineering Council (JEDEC). The UFS system 2000 may include a UFS host 2100, a UFS device 2200, and a UFS interface 2300. The above description of the memory system 1000 of FIG. 12 may be directly applicable to the UFS system 2000 without conflicting with the following description of the UFS system 2000.

Referring to FIG. 13, the UFS host 2100 and the UFS device 2200 may be connected via the UFS interface 2300. In a case in which the main processor 1100 of FIG. 12 is an application processor, the UFS host 2100 may be implemented as part of the application processor. A UFS host controller 2110 and a host memory 2140 may correspond to the controller 1120 and the memories 1200a and 1200b, respectively, of the main processor 1100 of FIG. 12. The UFS device 2200 may correspond to the storage devices 1300a and 1300b of FIG. 12. A UFS device controller 2210 and a nonvolatile storage device 2220 may correspond to the storage controllers 1310a and 1310b and the NVM storage devices 1320a and 1320b, respectively, of FIG. 12.

The UFS host 2100 may include the UFS host controller 2110, an application 2120, a UFS driver 2130, the host memory 2140, and a UFS interconnect (UIC) layer 2150. The UFS device 2200 may include the UFS device controller 2210, the nonvolatile storage device 2220, a storage interface 2230, a device memory 2240, a UIC layer 2250, and a regulator 2260. The nonvolatile storage device 2220 may include a plurality of storage units 2221, and the storage units 2221 may include 2D or 3D V-NAND flash memories or other flash memories such as PRAMs and/or RRAMs. The UFS device controller 2210 and the nonvolatile storage device 2220 may be connected via the storage interface 2230. The storage interface 2230 may be configured to conform to a standard such as TOGGLE or ONFI.

The application 2120 may be a program that communicates with the UFS device 2200 to use the functions of the UFS device 2200. The application 2120 may transmit an input/output request IOR to the UFS driver 2130 to input data to, or output data from, the UFS device 2200. The input/output request IOR may be, for example, a read request, a write request, and/or a discard request, but embodiments of the present disclosure are not limited thereto.

The UFS driver 2130 may manage the UFS host controller 2110 via a UFS-host controller interface (HCI). The UFS driver 2130 may convert the input/output request IOR provided by the application 2120 into one or more UFS commands, which are defined by the UFS standard, and may transmit the one or more UFS commands to the UFS host controller 2110. The input/output request IOR may be converted into a plurality of UFS commands. The UFS commands may be commands defined by the Small Computer System Interface (SCSI) command or by the UFS standard.

The UFS host controller 2110 may transmit the UFS commands provided by the UFS driver 2130 to the UIC layer 2250 of the UFS device 2200 via the UIC layer 2150 and the UFS interface 2300. In this process, the UFS host register 2111 of the UFS host controller 2110 may function as a command queue (CQ).

The UIC layer 2150 of the UFS host 2100 may include a MIPI M-PHY 2151 and a MIPI UniPro 2152, and the UIC layer 2250 of the UFS device 2200 may include a MIPI M-PHY 2251 and a MIPI UniPro 2252.

The UFS interface 2300 may include a line for transmitting a reference clock REF_CLK, a line for transmitting a hardware reset signal RESET_n for the UFS device 2200, a pair of lines for transmitting a pair of differential input signals DIN_t and DIN_c, and a pair of lines for transmitting a pair of differential output signals DOUT_t and DOUT_c.

The frequency of the reference clock signal REF_CLK, which is provided from the UFS host 2100 to the UFS device 2200, may be one of about 19.2 MHz, about 26 MHz, about 38.4 MHz, and about 52 MHz, but embodiments of the present disclosure are not limited thereto. The frequency of the reference clock signal REF_CLK may be changed during the operation of the UFS host 2100, e.g., during the transmission of data between the UFS host 2100 and the UFS device 2200. The UFS device 2200 may generate clock signals with various frequencies from the reference clock signal REF_CLK provided by the UFS host 2100, using a phase-locked loop (PLL). The UFS host 2100 may set the data rate between the UFS host 2100 and the UFS device 2200 based on the frequency of the reference clock signal REF_CLK. That is, the data rate between the UFS host 2100 and the UFS device 2200 may be determined based on the frequency of the reference clock signal REF_CLK.

The UFS interface 2300 may support multiple lanes, and each of the lanes may include one or more differential pairs. For example, the UFS interface 2300 may include one or more receive (RX) lanes and one or more transmit (TX) lanes. Referring to FIG. 13, the pair of lines for transmitting the differential input signals DIN_t and DIN_c may form RX lanes, and the pair of lines for transmitting the differential output signals DOUT_t and DOUT_c may form TX lanes. FIG. 13 illustrates one TX lane and one RX lane, but the numbers of TX lanes and RX lanes may vary according to embodiments of the present disclosure. The UFS interface 2300 may be any one of the memory interfaces of FIGS. 1 through 11.

The RX lanes and the TX lanes may transmit data in a serial communication manner, the RX lanes and the TX lanes are separate, and the UFS host 2100 and the UFS device 2200 can communicate in a full duplex manner. That is, the UFS device 2200 may transmit data to the UFS host 2100 via the TX lanes while receiving data from the UFS host 2100 via the RX lanes. Control data such as commands transmitted from the UFS host 2100 to the UFS device 2200 or user data to be stored in, or read from, the nonvolatile storage device 2220 of the UFS device 2200 by the UFS host 2100 may be transmitted via the same lanes. Accordingly, separate lanes for transmitting data, other than the pair of RX lanes and the pair of TX lanes, between the UFS host 2100 and the UFS device 2200, are not required according to some embodiments.

The UFS device controller 2210 of the UFS device 2200 may generally control the operation of the UFS device 2200. The UFS device controller 2210 may manage the nonvolatile storage device 2220 via logical units 2211, which are the units in which logic data is stored. The UFS device controller 2210 may include eight logical units 2211, but embodiments of the present disclosure are not limited thereto. The UFS device controller 2210 may include a flash translation layer (FTL) and may convert a logic data address received from the UFS host 2100, for example, a logical block address (LBA), into a physical data address, for example, a physical block address (PBA), using address mapping information of the FTL. A logic block for storing user data in the UFS system 2000 may have a predetermined size. For example, the size of the logic block may be set to a minimum of 4 Kbyte.

In response to a command from the UFS host 2100 being input to the UFS device 2200 via the UIC layer 2250, the UFS device controller 2210 may perform an operation corresponding to the input command and may transmit a completion response to the UFS host 2100 when the operation is completed.

For example, for the UFS host 2100 to store user data in the UFS device 2200, the UFS host 2100 may transmit a command to store data to the UFS device 2200. In response to a ready-to-transfer response being received from the UFS device 2200, the UFS host 2100 may transmit user data to the UFS device 2200. The UFS device controller 2210 may temporarily store the user data in the device memory 2240 and may store the temporarily stored user data at a selected location in the nonvolatile storage device 2220 based on the address mapping information of the FTL.

In another example, for the UFS host 2100 to read user data from the UFS device 2200, the UFS host 2100 may transmit a command to read data to the UFS device 2200. Then, the UFS device controller 2210 may read user data from the nonvolatile storage device 2220 based on the command to read data and may temporarily store the user data in the device memory 2240. During this process, the UFS device controller 2210 may detect and correct an error(s) in the user data using an error correction code (ECC) circuit. The UFS device controller 2210 may transmit the temporarily stored user data to the UFS host 2100. The UFS device controller 2210 may further include an advanced encryption standard (AES) circuit. The AES circuit may encrypt or decrypt data input to the UFS device controller 2210, using a symmetric key algorithm.

The UFS host 2100 may store commands to be transmitted to the UFS device 2200 to the UFS host register 2111, which may function as a command queue, in a predetermined sequence and may transmit the commands to the UFS device 2200 in the predetermined sequence. Even when a command previously transmitted to the UFS device 2200 is still being processed by the UFS device 2200, that is, even when a completion notification is yet to be received indicating that the processing of the previously transmitted command is completed by the UFS device 2200, the UFS host 2100 may still continue to transmit a subsequent command waiting in the command queue to the UFS device 2200, and as a result, the UFS device 2200 may receive the subsequent command from the UFS host 2100 while processing the previously transmitted command. The maximum number of commands that can be stored in the command queue, e.g., the queue depth of the command queue, may be 32. Also, the command queue may be implemented as a circular queue indicating the beginning and the end of a command array stored in the command queue, with a head pointer and a tail pointer.

Each of the storage units 2221 may include a memory cell array and a control circuit for controlling the operation of the memory cell array. The memory cell array may include a 2D or 3D memory cell array. The memory cell array may include a plurality of memory cells, and the memory cells may be single-level cells (SLCs) capable of storing data of one bit or cells capable of storing data of two or more bits, such as, for example, multi-level cells (MLCs), triple-level cells (TLCs), or quadruple-level cells (QLCs). The 3D memory cell array may include a V-NAND string that is vertically oriented such that at least one memory cell is located above another memory cell.

Power supply voltages VCC, VCCQ1, and VCCQ2 may be input to the UFS device 2200. The power supply voltage VCC, which is a main power supply voltage for the UFS device 2200, may range from about 2.4 V to about 3.6 V. The power supply voltage VCCQ1, which is a power supply voltage for supplying a range of low voltages, may be mainly for the UFS device controller 2210 and may range from about 1.14 V to about 1.26 V. The power supply voltage VCCQ2, which is a power supply voltage for supplying a range of voltages that are lower than the power supply voltage VCC, but higher than the power supply voltage VCCQ1, may be for an input/output interface such as the MIPI M-PHY 2251 and may range from about 1.7 V to about 1.95 V. The power supply voltages VCC, VCCQ1, and VCCQ2 may be supplied to the UFS device 2200 via the regulator 2260. The regulator 2260 may be implemented as a set of unit regulators connected to different power supply voltages among the power supply voltages VCC, VCCQ1, and VCCQ2.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

In an embodiment of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present disclosure, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present disclosure has been particularly shown and described with reference to the embodiments thereof, it will be understood by those of ordinary skill in the art that various changes in form and detail may be made therein without departing from the spirit and scope of the present disclosure as defined by the following claims.

What is claimed is:

1. A memory device, comprising:
   a multiphase clock generator, which generates a plurality of divided clock signals;
   a first error correction block, which receives a first divided clock signal among the plurality of divided clock signals;
   a first data multiplexer, which transmits first least significant bit data corresponding to the first divided clock signal;
   a second error correction block, which receives the first divided clock signal; and
   a second data multiplexer, which transmits first most significant bit data corresponding to the first divided clock signal,
   wherein
   the first error correction block receives the first least significant bit data and corrects a toggle timing of the first least significant bit data, and the second error correction block receives the first most significant bit data and corrects a toggle time of the first most significant bit data.

2. The memory device of claim 1, wherein at least one of the first error correction block and the second error correction block includes a quadrature error correction (QEC) circuit.

3. The memory device of claim 1, wherein at least one of the first error correction block and the second error correction block includes a duty cycle correction (DCC) circuit.

4. The memory device of claim 1, further comprising:
a pre-error correction block connected to the multiphase clock generator, which receives the plurality of divided clock signals from the multiphase clock generator.

5. The memory device of claim 4, wherein the pre-error correction block corrects a duty error of at least some of the plurality of divided clock signals.

6. The memory device of claim 1, further comprising:
a third error correction block, which receives the first divided clock signal; and
a third data multiplexer, which transmits first central significant bit data corresponding to the first divided clock signal.

7. The memory device of claim 6, wherein the third error correction block receives the first central significant bit data and corrects a toggle time of the first central significant bit data.

8. A memory device, comprising:
is a memory interface;
a control logic circuit, which receives a command from the memory interface; and
a memory cell array controlled by the control logic circuit, which stores data,
wherein
the memory interface generates a plurality of divided clock signals via a multiphase clock generator, receives a first divided clock signal among the plurality of divided clock signals via a first error correction block and transmits first least significant bit data corresponding to the first divided clock signal via a first data multiplexer, receives the first divided clock signal via a second error correction block and transmits first most significant bit data corresponding to the first divided clock signal via a second data multiplexer,
the first error correction block receives the first least significant bit data and corrects a toggle time of the first least significant bit data, and
the second error correction block receives the first most significant bit data and corrects a toggle time of the first most significant bit data.

9. The memory device of claim 8, wherein at least one of the first error correction block and the second error correction block includes a quadrature error correction (QEC) circuit.

10. The memory device of claim 8, wherein at least one of the first error correction block and the second error correction block includes a duty cycle correction (DCC) circuit.

11. The memory device of claim 8, further comprising:
a pre-error correction block connected to the multiphase clock generator, which receives the plurality of divided clock signals from the multiphase clock generator.

12. The memory device of claim 11, wherein the pre-error correction block corrects a duty error of at least some of the plurality of divided clock signals.

13. The memory device of claim 8, further comprising:
a third error correction block, which receives the first divided clock signal; and
a third data multiplexer which transmits first central significant bit data corresponding to the first divided clock signal.

14. The memory device of claim 13, wherein the third error correction block receives the first central significant bit data and corrects a toggle time of the first central significant bit data.

15. A memory system, comprising:
a memory controller including a controller interface circuit; and
a memory device, comprising:
a memory interface, which receives a signal from the memory controller;
a control logic circuit, which receives a command from the memory interface; and
a memory cell array, which stores data and is connected to the control logic circuit,
wherein the memory interface comprises:
a multiphase clock generator, which generates a plurality of divided clock signals;
a first error correction block, which receives a first divided clock signal among the plurality of divided clock signals;
is a first data multiplexer, which transmits first least significant bit data corresponding to the first divided clock signal;
a second error correction block, which receives the first divided clock signal; and
a second data multiplexer, which transmits first most significant bit data corresponding to the first divided clock signal,
wherein the first error correction block receives the first least significant bit data and corrects a toggle time of the first least significant bit data, and
the second error correction block receives the first most significant bit data and corrects a toggle time of the first most significant bit data.

16. The memory system of claim 15, wherein at least one of the first error correction block and the second error correction block includes a quadrature error correction (QEC) circuit.

17. The memory device of claim 15, wherein at least one of the first error correction block and the second error correction block includes a duty cycle correction (DCC) circuit.

18. The memory system of claim 15, further comprising:
a pre-error correction block connected to the multiphase clock generator, which receives the plurality of divided clock signals from the multiphase clock generator.

19. The memory system of claim 18, wherein the pre-error correction block corrects a duty error of at least some of the plurality of divided clock signals.

20. The memory system of claim 15, further comprising:
a third error correction block, which receives the first divided clock signal; and
a third data multiplexer, which transmits first central significant bit data corresponding to the first divided clock signal,
wherein the third error correction block receives the first central significant bit data and corrects a toggle time of the first central significant bit data.

* * * * *